(12) United States Patent
Faria et al.

(10) Patent No.: US 9,754,850 B2
(45) Date of Patent: Sep. 5, 2017

(54) CIRCUIT CARRIER INCLUDING A SILICONE POLYMER COATING

(71) Applicant: Robert Bosch GmbH, Stuttgart (DE)

(72) Inventors: Isabel Faria, Kornwestheim (DE); Peter Pfeiffer, Ludwigsburg (DE); Heiko Elsinger, Sulzfeld (DE); Andre Hahn, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/110,907

(22) PCT Filed: Dec. 2, 2014

(86) PCT No.: PCT/EP2014/076248
§ 371 (c)(1),
(2) Date: Jul. 11, 2016

(87) PCT Pub. No.: WO2015/106874
PCT Pub. Date: Jul. 23, 2015

(65) Prior Publication Data
US 2016/0329259 A1 Nov. 10, 2016

(30) Foreign Application Priority Data
Jan. 14, 2014 (DE) .................. 10 2014 200 492

(51) Int. Cl.
*H01L 21/56* (2006.01)
*H01L 23/00* (2006.01)
(Continued)

(52) U.S. Cl.
CPC .......... *H01L 23/295* (2013.01); *C09D 183/04* (2013.01); *H01L 21/563* (2013.01);
(Continued)

(58) Field of Classification Search
CPC ..... H01L 23/295; H01L 23/296; H01L 23/26; H01L 23/3121; H01L 21/563;
(Continued)

(56) References Cited

U.S. PATENT DOCUMENTS

2007/0221712 A1* 9/2007 Matsumoto .......... B23K 35/025
228/248.1
2008/0226902 A1 9/2008 Giannantonio et al.
(Continued)

FOREIGN PATENT DOCUMENTS

| DE | 102010043811 (A1) | 5/2012 |
|---|---|---|
| JP | 2006152017 (A) | 6/2006 |
| WO | WO 2006033439 (A1) | 3/2006 |

OTHER PUBLICATIONS

International Search Report dated Feb. 4, 2015, of the corresponding International Application PCT/EP2014/076248 filed Dec. 2, 2014, 2 pages.
(Continued)

*Primary Examiner* — Jasmine Clark
(74) *Attorney, Agent, or Firm* — Norton Rose Fulbright US LLP; Gerard Messina

(57) ABSTRACT

A circuit carrier. The circuit carrier has at least one electronic component, the electronic component being soldered to the circuit carrier, in particular with the aid of a flux. The circuit carrier has, in particular, an electrically insulating protective layer for anti-condensation, a surface of the circuit carrier being covered at least partially with the protective layer. The protective layer of the circuit carrier is formed by a silicon polymer layer designed to be activatable with the aid of ultraviolet radiation, the silicon polymer layer having filler particles distributed in the silicon polymer layer, in particu-
(Continued)

lar homogenously. At least a part of the filler particles or all filler particles have at least one salt of an alkaline earth metal.

10 Claims, 2 Drawing Sheets

(51) Int. Cl.
    *H01L 23/29*     (2006.01)
    *H01L 23/31*     (2006.01)
    *C09D 183/04*     (2006.01)
    *H01L 23/26*     (2006.01)
    *C08G 77/12*     (2006.01)
    *C08G 77/20*     (2006.01)
    *C08K 3/22*     (2006.01)
    *C08K 3/26*     (2006.01)

(52) U.S. Cl.
    CPC .......... *H01L 23/26* (2013.01); *H01L 23/296* (2013.01); *H01L 23/3121* (2013.01); *H01L 24/27* (2013.01); *H01L 24/32* (2013.01); *C08G 77/12* (2013.01); *C08G 77/20* (2013.01); *C08K 2003/2227* (2013.01); *C08K 2003/265* (2013.01); *C08K 2003/267* (2013.01); *C08K 2201/003* (2013.01); *C08K 2201/005* (2013.01); *H01L 2224/29611* (2013.01); *H01L 2224/32225* (2013.01); *H01L 2924/0002* (2013.01); *H01L 2924/186* (2013.01)

(58) Field of Classification Search
    CPC ... H01L 33/56; H01L 2924/181; H01L 24/32; C08K 2003/265; C08K 2003/2227; C08K 2201/003
    See application file for complete search history.

(56) References Cited

U.S. PATENT DOCUMENTS

| | | |
|---|---|---|
| 2009/0099283 A1 | 4/2009 | Ishihara et al. |
| 2011/0007490 A1 | 1/2011 | Onishi |
| 2015/0274938 A1* | 10/2015 | Okawa .................. C08K 9/06 257/100 |

OTHER PUBLICATIONS

Database WPI, Week 200646, Jun. 15, 2006, Thomson Scientific, London, GB, AN 2006-448036, XP002734876, 4 pages.

* cited by examiner

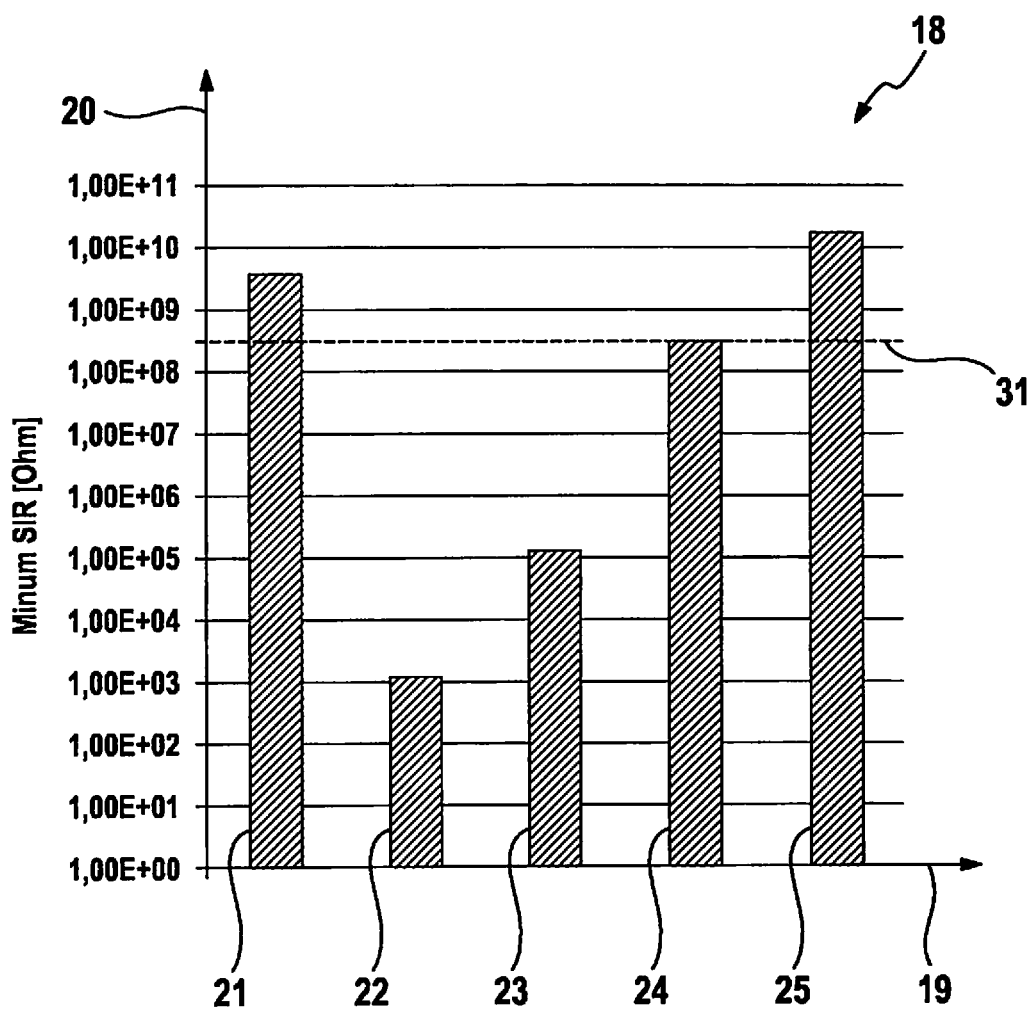

CIRCUIT CARRIER INCLUDING A SILICONE POLYMER COATING

FIELD

The present invention relates to a circuit carrier. The circuit carrier has at least one electronic component, the electronic component being soldered to the circuit carrier, in particular with the aid of a flux. The circuit carrier has, in particular, an electrically insulating protective layer for anti-condensation, a surface of the circuit carrier being covered at least partially with the protective layer.

BACKGROUND INFORMATION

To protect circuit boards, conventional silicone coatings may be use which are designed to protect circuit boards from moisture and contamination, in particular electrical contacts of components and strip conductors of the circuit board. Silicone polymers have an advantageous high temperature resistance, in particular as thin varnish layers or as a thick varnish layer forming a sealing compound.

SUMMARY

According to the present invention, the protective layer of the circuit carrier is formed by a silicone polymer layer designed to be activatable preferably with the aid of ultraviolet radiation, the silicone polymer layer having filler particles distributed in the silicone polymer layer, in particular homogeneously. At least one part of the filler particles or all filler particles have at least one salt of an alkaline earth metal.

It has been found that the electrical contacts of the components disadvantageously form corrosion despite the use of a protective layer formed by a silicone varnish. It has been further found that the mentioned corrosion is caused by polar active adhesion promoters as a component of the silicone varnish. It has been further found that the adhesion promoters, in combination with a water vapor permeability of the silicon varnish, induce an accumulation of moisture at an interface between the silicone varnish and the circuit board, where the moisture may interact with a flux residue of a flux, in particular as a constituent of a so-called non-clean soldering paste, remaining during the soldering of the electronic component. It has been further found that acids and ions contained in the flux residue, together with the moisture migrated to the interface at the electrical contacts of the electronic components or at strip conductors of the circuit carrier, in particular at copper strip conductors of the circuit carrier, may cause the corrosion mentioned at the outset.

It has been surprisingly shown that the filler particles, in particular in the case of a salt or an oxide of an alkaline earth metal, in particular, calcium carbonate or aluminum oxide, may advantageously reduce or even prevent the moisture migration from outside through the protective layer up to the circuit carrier.

The proportion of filler particles is preferably at least 5 percent, more preferably between 5 percent and 50 percent.

Thus, a good vapor barrier effect may be advantageously achieved.

The silicone protective varnish preferably includes a base polymer, in particular polysilane, a silicon-hydride crosslinker, a platinum catalyst formed to be activatable with the aid of ultraviolet radiation, and a silane adhesion promoter.

The silicone polymer layer is preferably generated by an addition-crosslinked sealing compound formed from two components, the two components being formed to crosslink with one another as a function of an exposure to ultraviolet radiation. A density of the polymer layer is, for example, 0.94 grams per cubic centimeter; a Shore Hardness 00 is preferably 40.

The silicone polymer is preferably vinyl terminated, in particular polyvinyl siloxane. A crosslinking polymer is, for example, an S—H terminated silicone polymer, in particular poly(hydrogen methyl siloxane).

The polymer, in particular polymer molecules in the protective layer, is preferably completely crosslinked with one another so that, unlike silicone gels, no liquid, like water, is embedded between the molecules or molecule chains.

The self-adhesiveness present in silicone gels is lost in the silicone protective varnish, in particular in the case of silicone rubber as a protective layer component, so that the previously mentioned adhesion promoter contributes to the adhesion to components of the circuit carrier, like the substrate or strip conductors, soldering agents, or electronic components.

In one preferred specific embodiment, the previously mentioned salt is a salt of carbonic acid, in particular carbonate or hydrogen carbonate. The salt is preferably selected from the group including carbonates of alkaline earth metals and aluminum. The salt is further preferably selected from the group including calcium carbonate, in particular limestone or chalk, calcium hydrogen carbonate, magnesium carbonate, magnesium hydrogen carbonate, aluminum carbonate, aluminum hydrogen carbonate. The carbonate is particularly preferably calcium carbonate and/or magnesium carbonate.

Independent of or in addition to the previously mentioned filler particles, the protective layer may include a salt which is selected from the group including at least one metal oxide and/or metal hydroxide. The group preferably includes calcium oxide, calcium hydroxide, magnesium oxide, magnesium hydroxide, hydromagnesite, hydrotalcite, huntite, aluminum oxide, aluminum hydroxide, and mica.

The filler particles preferably have a grain size between 0.1 micrometer and 100 micrometers, preferably between 0.1 and 10 micrometers. The filler particles are preferably hydrophobized filler particles, in particular, superficially hydrophobized filler particles. The filler particles preferably effectuate a reduction or prevention of a moisture migration through the protective layer up to the circuit carrier.

In one preferred specific embodiment, a matrix of the protective layer, in particular of the protective varnish, is an elastically formed silicone rubber. With the aid of the silicone rubber, strip conductors, which are connected to the circuit carrier, and also terminals of electronic components, which extend transversely to the flat extension of the circuit carrier, may be advantageously covered with the aid of a sufficiently thickly formed protective layer.

For example, a layer thickness of the protective layer may be between 5 and 2000 micrometers, in which electrical contacts and strip conductors are covered in an electrically insulated way.

The circuit carrier, in particular components of the circuit carrier or components connected to the circuit carrier, may additionally advantageously not tear during thermal expansions insofar as the protective layer is advantageously elastically formed and thus may elastically yield during thermally caused expansions of components or electrical terminals of the components.

In one preferred specific embodiment, the silicone varnish has an adhesion promoter. The adhesion promoter is, for example, GLYMO, in particular 3-(2,3-epoxypropoxy)propyl trimethoxysilane.

In one preferred specific embodiment, the filler particles or at least one part of the filler particles have at least one oxide of at least one alkaline earth metal. The filler particles preferably contain magnesium oxide, calcium oxide, or aluminum oxide.

In one preferred specific embodiment, at least one part of the filler particles are arranged at an interface of the protective layer to the circuit carrier and are formed to decompose the acid using an acid deposited from the circuit carrier or remaining from the flux, in particular using a proton transfer reaction.

The circuit carrier preferably includes a substrate, for example, a fiber-reinforced circuit board, in particular an epoxy resin circuit board, strip conductors formed by an electrically conductive layer, in particular a copper layer, more preferably a solder resist and soldering agent connected to the strip conductors, and the at least one electronic component.

Advantageously, inexpensively providable filler particles from calcium carbonate may thus be reacted to carbonic acid using the remaining acid, for example a carboxylic acid, in particular dicarboxylic acid, and thus decompose the carboxylic acid, which is harmful to the electrical contacts and terminals, by splitting off carbon dioxide.

The filler particles thus advantageously have a dual function, specifically the previously mentioned prevention of moisture migration through the protective layer and further, in the case of moisture migration through the protective layer, a decomposition of the acids remaining from the flux or a decomposition of acid salts of metal ions on the circuit carrier.

In one preferred specific embodiment, a volume proportion of the filler particles in the protective layer, in particular the silicone protective varnish, is between 2 percent and 50 percent, preferably between 5 percent and 30 percent. Volume proportions of more than 50 percent of the filler particles in the silicone varnish have shown that the silicone varnish becomes viscous and thus may only be applied to the circuit carrier with difficulty.

In one preferred specific embodiment, the filler particles in the protective layer are distributed in particular in the silicone varnish in such a way that the circuit carrier is directly contacted by at least a part of the filler particles. Thus, the filler particles, in particular carbonates of alkaline earth metals, preferably calcium carbonate, may particularly easily end up in a direct operative contact with the circuit carrier and with the acid remaining or deposited there or in an electrolyte including acid salts formed by moisture migration on the circuit carrier and thus decompose the acid or the acid salts.

In one preferred specific embodiment, a diameter of the filler particles is smaller than five micrometers. Thus a sufficient flowability of the silicone varnish may be advantageously achieved during application on the circuit carrier, whereby the silicone varnish may have a high filling ratio of the filler particles.

The present invention also relates to a method for generating a protective varnish for a circuit carrier of the previously described type. In the method, a silicone varnish formed to be UV activatable is mixed with filler particles, in particular already described, and thus a particle-containing silicone varnish is generated as a mixing product. The filler particles are preferably uniformly distributed in the silicon varnish.

The present invention also relates to a method for generating a circuit carrier, in which at least one electronic component is soldered to the circuit carrier with the aid of an acid-containing or an acid-releasing flux, in particular a so-called non-clean soldering paste. The circuit carrier is coated in a method step with the aid of a silicone protective varnish, the silicone protective varnish including filler particles containing a salt of an alkaline earth metal, in particular calcium carbonate particles with a volume proportion between 2 and 50 percent.

The present invention is described below based on figures and additional exemplary embodiments. Additional advantageous embodiment variants arise from the features described below and the figures.

BRIEF DESCRIPTION OF THE DRAWINGS

FIG. 3 shows a diagram in which measured values of a test are presented to demonstrate the moisture inhibiting effect of the protective layer in FIG. 2.

DETAILED DESCRIPTION OF EXAMPLE EMBODIMENTS

Figure 1:
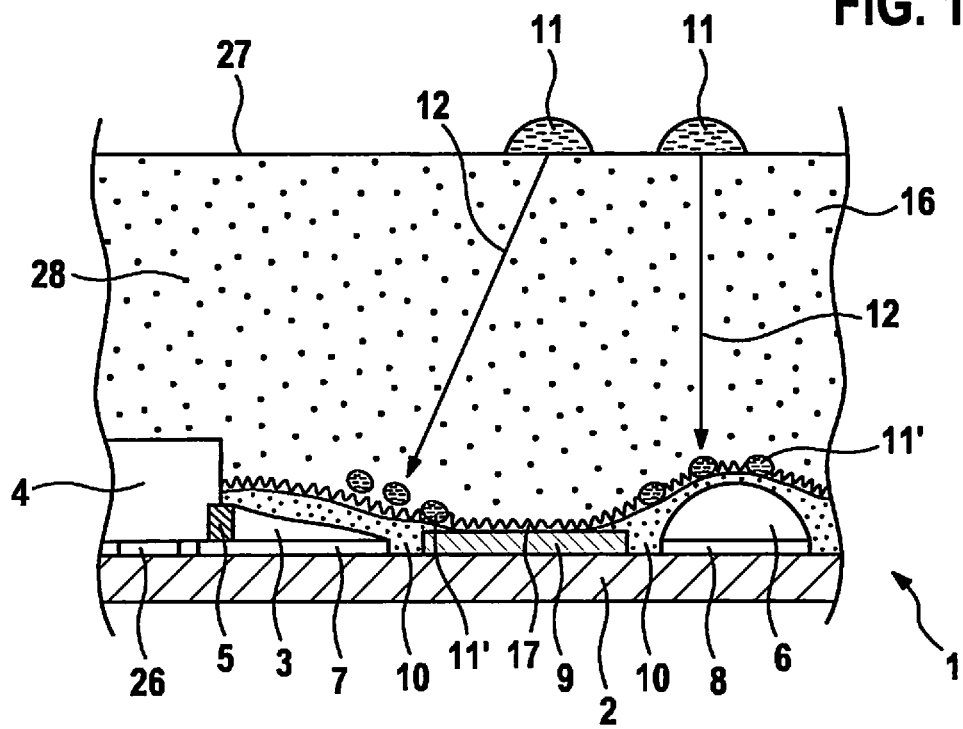
FIG. 1 shows an exemplary embodiment for a circuit carrier in which a substrate and at least electrical terminals of components connected to the circuit carrier and soldering points are covered with the aid of a protective layer formed to be moisture transmitting.

FIG. 1 shows an exemplary embodiment for a circuit carrier 1. Circuit carrier 1 has a substrate 2, in particular a fiber-reinforced circuit board. Circuit carrier 1 also has an electronic component 4 solder connected to circuit board 2 with the aid of a soldering agent 3. Electronic component 4 in this exemplary embodiment is presented sectionally and is, for example, formed by an integrated circuit, in particular an SMD component (surface mounted device).

Electronic component 4 has an electrical terminal 5 which is soldered to a strip conductor 7 of circuit board 2 with the aid of soldering agent 3, in particular a tin-containing solder, in the exemplary embodiment using a reflow soldering method. Component 4 is glued to circuit board 2 with the aid of an adhesive 26. Circuit board 2 has, in addition to strip conductor 7, also another strip conductor 8, a soldering agent, in particular solder beads 6, being solder connected to strip conductor 8.

Strip conductors 7 and 8 are spaced apart from one another along a flat extension of circuit board 2, an area of circuit board 2 extending between strip conductors 7 and 8 being covered with the aid of a solder resist 9.

A flux residue 10 is also shown which contains carboxylic acids in this exemplary embodiment.

Flux residue 10 covers electrical terminal 5, soldering agent 3, and soldering agent 6 in this exemplary embodiment.

Circuit board 2 is covered with the aid of a silicone protective varnish 16. Electronic component 4 and also soldering agents 3 and 6, which each extend hydrophobically up from circuit board 2, are covered with the aid of silicone protective varnish 16.

Water drops 11, which have deposited on silicone protective varnish 16, for example, as condensed water vapor as a result of condensation of circuit board 2, are shown on a surface 27 of silicone protective varnish 16.

FIG. 1 also shows arrows 12 which run from water drops 11 to an interface 17 of the silicone protective varnish to circuit board 2. Arrows 12 each represent a water vapor migration from water drops 11 through silicone protective varnish 16 up to interface 17, where transmigrated water vapor may condense out again as water drops 11'.

The transmigration in this exemplary embodiment is promoted or effectuated by a polar active adhesion promoter 28 contained in protective layer 16.

The water drops deposited on interface 17, like water drops 11', may dissociate with the salts and acids contained in flux residue 10 into condensed water drops 11' and ions thus formed with soldering agent 3 and also with electrical terminal 5 or strip conductor 7 may lead to a redox reaction designated as corrosion.

Figure 2:
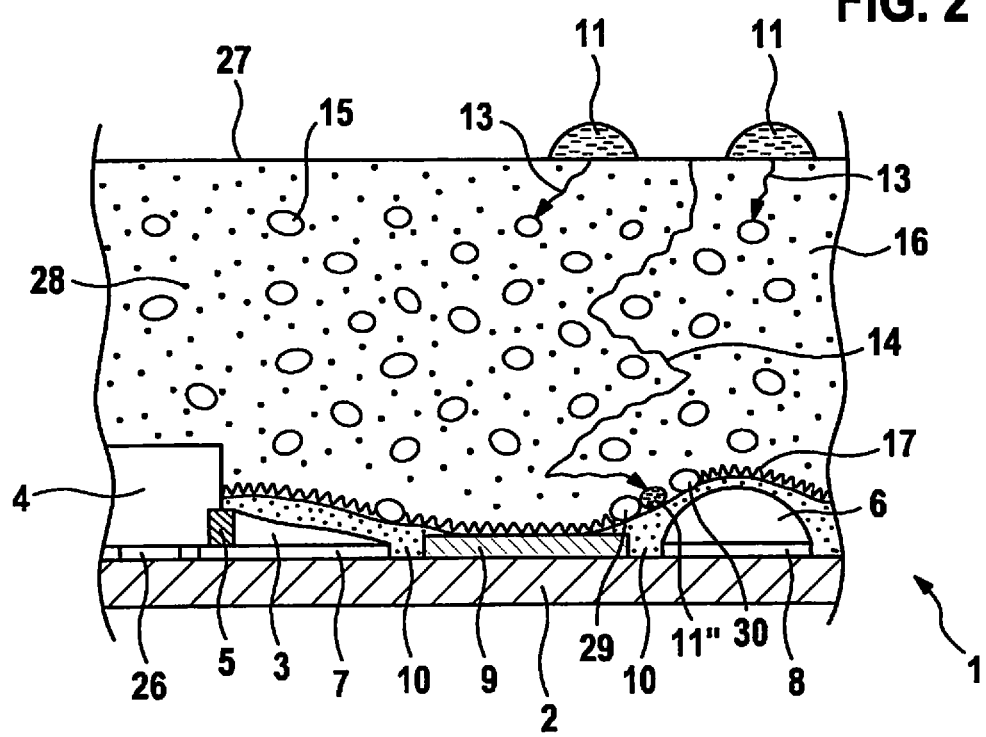
FIG. 2 shows a variant of the circuit carrier shown in FIG. 1, in which the protective layer is formed to inhibit moisture transmission.

FIG. 2 shows a circuit carrier 40, which forms a variant of circuit carrier 1 already shown in FIG. 1 and is improved according to the present invention in comparison to circuit carrier 1. Silicone protective varnish 16 has a filler proportion, the filler being formed by filler particles, in particular calcium carbonate particles and/or aluminum oxide particles, of which one filler particle 15 is designated by way of example.

Water drops 11 condensed on surface 27 may—indicated by arrows 13—migrate up to polar active filler particles 15, filler particles 15 representing a barrier for migration 13. Filler particles 15 advantageously also form a prevention of a large polarity difference between a matrix of silicone varnish 16 and interface 17 toward circuit board 2.

A migration path 14 represents a small proportion of water vapor from water drops 11 which—passing past filler particles 15—migrates through silicone varnish 16 up to interface 17 and is condensed out there as condensed water drop 11".

Filler particles 29 and 30 are also shown, which are formed like filler particle 15; however, in contrast to filler particle 15, filler particles 29 and 30 at least partially form interface 17 and thus may directly contact circuit board 2, in particular the components connected to circuit board 2 and extending hydrophobically from circuit board 2, like soldering agents 3 and 6, and solder resist 9, and also flux residue 10. Filler particles 29 and 30, which are formed like filler particles 15 in this exemplary embodiment as calcium carbonate particles, may undergo a proton transfer reaction with the hydroxonium ions formed from the acid of flux residue 10 in condensed water drop 11" and thus form carbonic acid which is comparatively harmless to the electrical contacts.

The carbonic acid, in particular carbon dioxide arising from additional dehydration, may diffuse into protective varnish 16 like the water vapor. Protective varnish 16 preferably has a permeability for carbonic acid, in particular, for carbon dioxide.

FIG. 3 shows a diagram 18. Diagram 18 shows measuring bars on an abscissa 19, the bars each representing a measured value for a surface resistance of the circuit carrier shown in FIG. 2.

Different protective layers were examined with respect to their surface resistance and their moisture transmission, the different protective layers having different proportions of filler particles in a silicone protective varnish.

The silicone protective varnish is Semicosil® 949 manufactured by Wacker Chemie, the filler particles are Winnofil® SPM calcium carbonate particles manufactured by Solvay.

The surface resistance was ascertained with the aid of a four-point measurement, in particular according to an IEC 61189-5 testing standard over a time period of 520 hours.

Measured value 21 represents a circuit carrier with a silicone protective varnish 16, which has no adhesion promoter, like adhesion promoter 28 shown in FIG. 2, and no filler particles, like five percent filler particles 15 shown in FIG. 2. A surface resistance of protective varnish 16 thus formed is comparatively good and is, in this exemplary embodiment, more than 500 megaohms. A dotted line 31 represents a surface resistance of 500 megaohms, which is plotted on an ordinate 20 of diagram 18.

A measured value 22 represents a substrate like substrate 2 in FIG. 2, silicone protective varnish 16 having an adhesion promoter, like adhesion promoter 28; however, no filler particles like filler particles 15. A surface resistance of silicone protective varnish 16 is only 1000 ohms in this case.

A measured value 23 represents a circuit carrier like circuit carrier 40 in FIG. 2, with a proportion of filler particles 15 of five percent in silicone protective varnish 16. A clear increase of the surface resistance, to 100 kilohms is apparent in comparison with measured value 22. Measured value 24 represents a circuit carrier like circuit carrier 40 in FIG. 2 in which silicone protective varnish 16 has a filler particle proportion of filler particles 15 of ten percent. It is apparent that an already good minimum resistance for electronic applications of 500 megaohms is already achieved with ten percent filler particles in the protective layer.

Measured value 25 represents a circuit carrier like circuit carrier 40 in FIG. 2, the protective layer, formed by silicone protective varnish 16, having a filler particle proportion of filler particles 15 of 30 percent. It is apparent that the resistance value of the surface resistance was able to be improved to more than 10 gigaohms, which surprisingly exceeds measured value 21. The layer thickness of silicone protective varnish 16, on which the measured values shown in FIG. 3 were ascertained, was 300 micrometers.

The exposure period of silicone protective varnish 16 to the moisture, like water drops 11 shown in FIG. 2, was at least 500 hours.

What is claimed is:

1. A device comprising:
   a circuit carrier including:
      a strip conductor; and
      at least one electronic component soldered to the strip conductor with the aid of a flux; and
   a protective layer for anti-condensation that:
      at least partially covers a surface of the circuit carrier; and
      is formed by a silicon polymer layer with filler particles, that include at least one salt of an alkaline earth metal, homogeneously distributed in the silicon polymer layer;
   wherein at least one of:
      a matrix of the protective layer is an elastically-formed, completely crosslinked silicone rubber;
      at least one part of the filler particles is at least one oxide of at least one alkaline earth metal;
      at least one part of the filler particles is arranged at an interface of the protective layer to the circuit carrier, and is formed to decompose acid using an acid deposited from the circuit carrier or remaining from the flux and using a proton transfer reaction; and a volume proportion of the filler particles in the protective layer is between 5 and 50 percent.

2. A device comprising:
a circuit carrier including:
a strip conductor; and
at least one electronic component soldered to the strip conductor with the aid of a flux; and
a protective layer for anti-condensation that:
at least partially covers a surface of the circuit carrier; and
is formed by a silicon polymer layer with filler particles, that include at least one carbonate or hydrocarbonate salt of an alkaline earth metal, homogeneously distributed in the silicon polymer layer.

3. The circuit carrier as recited in claim 1, wherein the matrix of the protective layer is the elastically-formed, completely crosslinked silicone rubber.

4. The circuit carrier as recited in claim 3, wherein the protective layer has an adhesion promoter.

5. The circuit carrier as recited in claim 1, wherein at least one part of the filler particles is the at least one oxide of the at least one alkaline earth metal.

6. The circuit carrier as recited in claim 1, wherein at least one part of the filler particles is arranged at the interface of the protective layer to the circuit carrier, and is formed to decompose acid using the acid deposited from the circuit carrier or remaining from the flux and using the proton transfer reaction.

7. The circuit carrier as recited in claim 1, wherein the volume proportion of the filler particles in the protective layer is between 5 and 50 percent.

8. The circuit carrier as recited in claim 6, wherein the filler particles are distributed in the protective layer in such a way that the circuit carrier is directly contacted by at least a part of the filler particles.

9. The circuit carrier as recited in claim 1, wherein a diameter of the filler particles is less than 5 micrometers.

10. A method for generating a circuit carrier, comprising:
soldering at least one electronic component to the circuit carrier with the aid of one of an acid-containing or an acid-releasing flux; and
coating the circuit carrier with the aid of a protective layer, the protective layer being a silicone protective varnish, the silicone protective varnish including filler particles containing a salt of an alkaline earth metal, the salt being calcium carbonate particles with a volume proportion between 10 and 50 percent.

* * * * *